United States Patent
Waskiewicz et al.

(10) Patent No.: US 10,461,172 B2
(45) Date of Patent: Oct. 29, 2019

(54) VERTICAL TRANSISTORS HAVING IMPROVED GATE LENGTH CONTROL USING UNIFORMLY DEPOSITED SPACERS

(71) Applicant: International Business Machines Corporation, Armonk, NY (US)

(72) Inventors: Christopher J. Waskiewicz, Rexford, NY (US); Hemanth Jagannathan, Niskayuna, NY (US); Yann Mignot, Slingerlands, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/850,585

(22) Filed: Dec. 21, 2017

(65) Prior Publication Data

US 2019/0198642 A1  Jun. 27, 2019

(51) Int. Cl.
*H01L 29/66* (2006.01)
*H01L 21/02* (2006.01)
*H01L 21/3105* (2006.01)
*H01L 29/78* (2006.01)
*H01L 21/3213* (2006.01)
*H01L 21/28* (2006.01)
*H01L 29/40* (2006.01)
*H01L 21/311* (2006.01)

(52) U.S. Cl.
CPC .... *H01L 29/66666* (2013.01); *H01L 21/0228* (2013.01); *H01L 21/28088* (2013.01); *H01L 21/31058* (2013.01); *H01L 21/31144* (2013.01); *H01L 21/32139* (2013.01); *H01L 29/401* (2013.01); *H01L 29/7827* (2013.01)

(58) Field of Classification Search
CPC ........... H01L 29/66666; H01L 21/0228; H01L 21/28088; H01L 21/31058; H01L 21/31144; H01L 21/32139; H01L 29/401; H01L 29/7827; H01L 21/823481; H01L 27/11273; H01L 27/2454; H01L 21/82285; H01L 21/823487; H01L 21/823885
See application file for complete search history.

(56) References Cited

U.S. PATENT DOCUMENTS

5,610,085 A   3/1997   Yuan et al.
6,097,046 A   8/2000   Plumton
(Continued)

*Primary Examiner* — Shahed Ahmed
(74) *Attorney, Agent, or Firm* — Cantor Colburn LLP; Vazken Alexanian (57) ABSTRACT

Embodiments of the invention are directed to a method of forming a semiconductor device by forming a channel fin over a substrate, wherein the channel fin includes a plurality of channel fins, wherein a first spacing is defined between adjacent ones of a first set of the plurality of channel fins, wherein a second spacing is defined between adjacent ones of a second set of the plurality of channel fins, wherein the first spacing is not equal to the second spacing. An initial gate structure is formed over the plurality of channels. Formed along sidewalls of the initial gate structure are spacers that each has a predetermined spacer height, wherein a thickness of each of the spacers is insufficient to allow any one of the spacers to fill the first spacing or the second spacing. Portions of the initial gate structure that are not covered by the spacers are removed.

12 Claims, 8 Drawing Sheets

(56) References Cited

U.S. PATENT DOCUMENTS

| | | |
|---|---|---|
| 6,156,611 A | 12/2000 | Lan et al. |
| 9,391,200 B2 | 7/2016 | Liu et al. |
| 9,530,700 B1 * | 12/2016 | Mallela ............... H01L 27/0924 |
| 9,607,899 B1 | 3/2017 | Cheng et al. |
| 9,711,618 B1 | 7/2017 | Cheng et al. |
| 9,799,751 B1 | 10/2017 | Zhang et al. |
| 9,805,935 B2 | 10/2017 | Anderson et al. |
| 9,806,153 B1 | 10/2017 | Cheng et al. |
| 2006/0226477 A1 | 10/2006 | Brar et al. |
| 2012/0280331 A1 * | 11/2012 | Ou ................... H01L 21/823431 257/401 |
| 2017/0317080 A1 * | 11/2017 | Cheng ............. H01L 21/823475 |
| 2017/0317260 A1 * | 11/2017 | Verheyen ................ H01L 35/34 |

* cited by examiner

VERTICAL TRANSISTORS HAVING IMPROVED GATE LENGTH CONTROL USING UNIFORMLY DEPOSITED SPACERS

BACKGROUND

The present invention relates in general to semiconductor devices and their fabrication. More specifically, the present invention relates to improved fabrication methodologies and resulting structures for vertical field effect transistors (VTFETs) having improved gate length control based at least in part on incorporating relatively thin and uniformly deposited/etched spacers to define the gate length dimension.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. A conventional geometry for MOSTFETs is known as a planar device geometry in which the various parts of the MOSFET device are laid down as planes or layers.

One type of MOSFET is a non-planar FET known generally as a VTFET. VTFETs employ semiconductor fins and side-gates that can be contacted outside the active region, resulting in increased device density and some increased performance over lateral devices. In VTFETs the source to drain current flows in a direction that is perpendicular to a major surface of the substrate. For example, in a known VTFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. An important parameter in VTFET designs is the gate length (Lgate).

SUMMARY

Embodiments of the invention are directed to a method of forming a semiconductor device. The method includes forming a channel fin structure across from a major surface of a substrate, wherein the channel fin structure includes a plurality of channel fins, wherein a first spacing is defined between adjacent ones of a first set of the plurality of channel fins, wherein a second spacing is defined between adjacent ones of a second set of the plurality of channel fins, wherein the first spacing is not equal to the second spacing. An initial gate structure is formed over the plurality of channels. Formed along vertical sidewall portions of the initial gate structure are spacers that each has a predetermined spacer height dimension, wherein a thickness dimension of each of the spacers is insufficient to allow any one of the spacers to fill the first spacing or the second spacing. Portions of the initial gate structure that are not covered by the spacers are removed to define a plurality of gate structures each having a gate structure height dimension defined by the spacer height dimension. A gate length dimension of each of the plurality of gate structures substantially equals the gate height dimension.

Embodiments of the invention are directed to a semiconductor device that includes a channel fin structure formed across from a major surface of a substrate, wherein the channel fin structure includes a plurality of channel fins, wherein a first spacing is defined between adjacent ones of a first set of the plurality of channel fins, wherein a second spacing is defined between adjacent ones of a second set of the plurality of channel fins, wherein the first spacing is not equal to the second spacing. Gate structures are formed along vertical sidewall portions of the plurality of channels. Spacers are formed along vertical sidewall portions of the gate structures, wherein each of the spacers has an upper horizontal spacer surface that defines a predetermined spacer height dimension, wherein a thickness dimension of each of the spacers is insufficient to allow any one of the spacers to fill the first spacing or the second spacing. Each of the gate structures includes a gate structure upper horizontal surface that is substantially co-planar with the upper horizontal spacer surface of each of the spacers. The gate structure upper horizontal surfaces define one end of a gate height dimension, and a gate length dimension of each of the plurality of gate structures substantially equals the gate height dimension.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VTFET, implementation of the teachings recited herein are not limited to a particular type of VTFET or IC architecture. Rather embodiments of the present invention are capable of being implemented in conjunction with any other type of VTFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1:
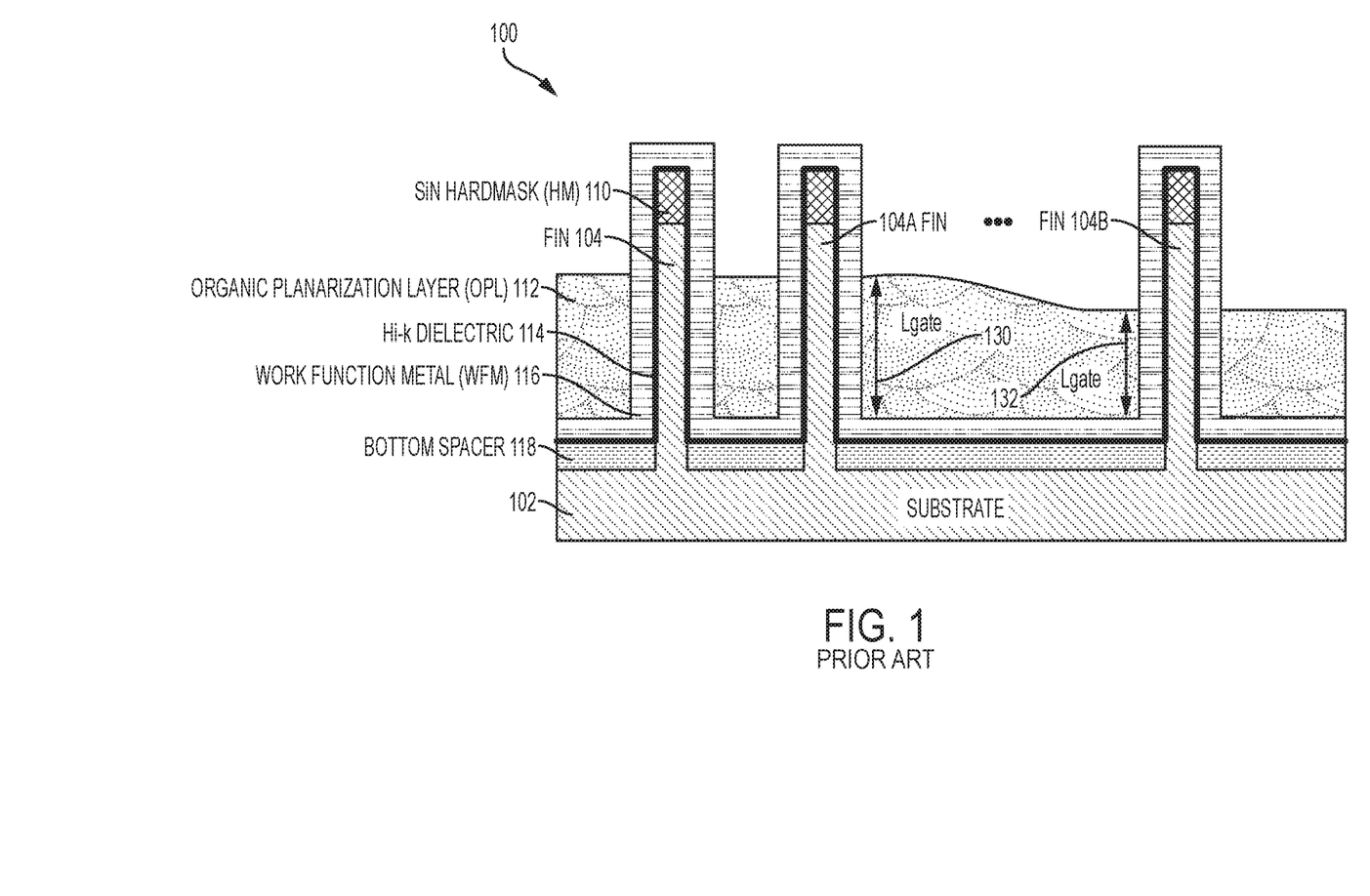
FIG. 1 depicts a cross-sectional view showing the state of a pattern of VTFET devices just prior to applying gate formation operations, wherein the VTFET devices include organic planarization layers (OPLs) having non-uniform height dimensions, which can result from using known OPL deposition and recess operations.

Turning now to an overview of technologies that are more specifically relevant to aspects of the present invention, as previously noted herein, some non-planar transistor device architectures, such as VTFETs, employ semiconductor fins and side-gates that can be contacted outside the active region, resulting in increased device density over lateral devices. FIG. 1 depicts a VTFET pattern 100 showing multiple VFETs after a known sequence of fabrication operations. As shown in FIG. 1, the VTFET pattern 100 at this fabrication stage includes a substrate 102, three fins 104, 104A, 104B, hardmasks 110, bottom spacers 118, a work function metal (WFM) layer 116, a high-k dielectric layer 114, and organic planarization layer (OPL) regions 112, configured and arranged as shown. It should be understood that the VFET pattern 100 has been simplified from an actual VFET pattern for ease of illustration and description.

The OPL 112 is formed, planarized, and recessed to the level(s) depicted in FIG. 1. In a subsequent fabrication operation, which is not shown in FIG. 1, the portions of the WFM layer 116 and the high-k dielectric layer 114 above the exposed upper surface of the OPL 112 are removed, and the portions of the WFM layer 116 and the high-k dielectric layer 114 below the exposed upper surface of the OPL 112 are preserved and form the vertical gate structure (not shown) of the final VTFET device. Hence, the vertical height of the OPL 112 defines the gate length (Lgate) of the gate structure.

A problem with using the vertical height of the OPL 112 to define Lgate is that the OPL 112 exhibits thickness (or height) deltas (pre and post recessing) based on the different densities of the OPL material in the relevant region. For example, in the transistor layout/design (i.e., macro) shown in FIG. 1, the space between fin 104A and fin 104B is greater than the space between fin 104A and fin 104. Similarly, the space from fin 104 to the left edge of the substrate 102 is less than the space from fin 104B to the right edge of the substrate 102. As a result, the underlying densities of the OPL 112 in the various regions around the fins 104, 104A, 104B are different, which results in the heights of the OPL 112 in these regions also being different. For example, the height of the OPL 112 between fin 104A and fin 104B is generally less than the height of the OPL 112 between fin 104A and fin 104. Additionally, the height of the OPL 112 between fin 104A and fin 104B varies. Similarly, the height of the OPL 112 from fin 104 to the left edge of the substrate 102 is greater than the height of the OPL 112 from fin 104B to the right edge of the substrate 102.

As shown in FIG. 1, the varying space around fins 104, 140A, 104B results in varying densities of the OPL 112 in the spaces around the fins 104, 140A, 104B, which results in variations in the height of the OPL 112, which results in variations in the Lgate dimension (e.g., Lgate 130, Lgate 132). Lgate is a critical transistor parameter, and variations in Lgate can have negative effects (e.g., variations) on a variety of VTFET parameters such as threshold voltage, drive current, leakage current, and the like. Accordingly, there is a need to form VTFET semiconductor devices with a precisely controlled and substantially uniform Lgate dimension within a given macro, as well as from one macro to another macro.

Turning now to an overview of aspects of the present invention, embodiments of the invention provide fabrication methods and resulting structures configured to eliminate the need to rely on the height of the OPL layer to define Lgate of a VTFET device. In embodiments of the invention, Lgate is defined by a height dimension of a relatively thin spacer formed along sidewalls of the initial gate structures, which have been conformally formed around the exposed surfaces of the channel fin portions of the VTFETs of a macro. In embodiments of the invention, the spacer is formed by conformally depositing a relatively thin (e.g., from about 20 A to about 70 A) layer of dielectric spacer material over the initial gate structures, and then performing a reactive ion etch (RIE) to remove selected portions of the dielectric spacer material. In embodiments of the invention, the relatively thin layer of dielectric spacer material is deposited using a precisely controlled layer-by-layer process such as atomic layer deposition (ALD). In embodiments of the invention, the RIE etches the relatively thin spacer layer in a substantially vertical direction until a desired spacer height is reached. The spacer height is selected to be substantially equal to the desired Lgate. The vertical gate structure is then formed by etching the initial gate structure selective to the height of the post-RIE relatively thin spacer layer. Hence, the height of the relatively thin spacer layer defines the Lgate dimension of the vertical gate structure.

Because the novel spacer described herein is relatively thin, it occupies a small fraction of the space that exists around any given channel fin in the macro during fabrication. Thus, the relatively thin spacer's thickness dimensions are not in any way constrained by the space around the channel fins during VTFET fabrication. Because the novel relatively thin spacer described herein is formed by a precisely controlled, layer-by-layer atomic growth process, along with a precisely controlled RIE process, the width and height of the relatively thin spacer material is uniform throughout the macro, and from macro to macro. Hence, unlike the varying widths/heights of the OPL 112 shown in FIG. 1, the width/height of the spacer material according to embodiments of the invention is independent of the space/area that surrounds any one of the channel fins during VTFET fabrication. According to embodiments of the invention, using the novel spacer arrangement described herein to define Lgate results in uniform Lgate dimensions that do not vary based on the space/area that surrounds a given channel fin.

In embodiments of the invention, an OPL can be deposited adjacent the relatively thin spacers in the remaining space between the channel fins of the VTFETs. The OPL can protect the non-etched portions of the gate structure from subsequent removal/etching processes. As previously noted herein, the OPL deposited in accordance with aspects of the invention can exhibit thickness (or height) deltas (pre and post OPL recessing) based on the density of the OPL material in the relevant region. More specifically, where the space between some channel fins is greater than the space between other channel fines, and where the space from some channel fins to the edge of the macro is greater than the space from other channel fines to the edge of the macro, the underlying densities of the OPL in the various regions around the channel fins are different, which results in the heights of the OPL in these regions also being different. However, in accordance with embodiments of the invention, because Lgate is defined by the closely controlled height of the relatively thin spacers, the height variations in the OPL need only be coarsely controlled to ensure that the maximum OPL height is below the Lgate dimension defined by the height dimension of the relatively thin spacer layers in order to not interfere with the relatively thin spacers performing the function of defining Lgate. Hence, in embodiments of the invention, the OPL is configured to protect the portions underneath the OPL from subsequent removal/etching processes but, because of the above-described relatively thin spacer layer along the gate structure sidewalls, the OPL according to aspects of the invention does not need to be configured (or relied on) to define Lgate.

Figure 2:
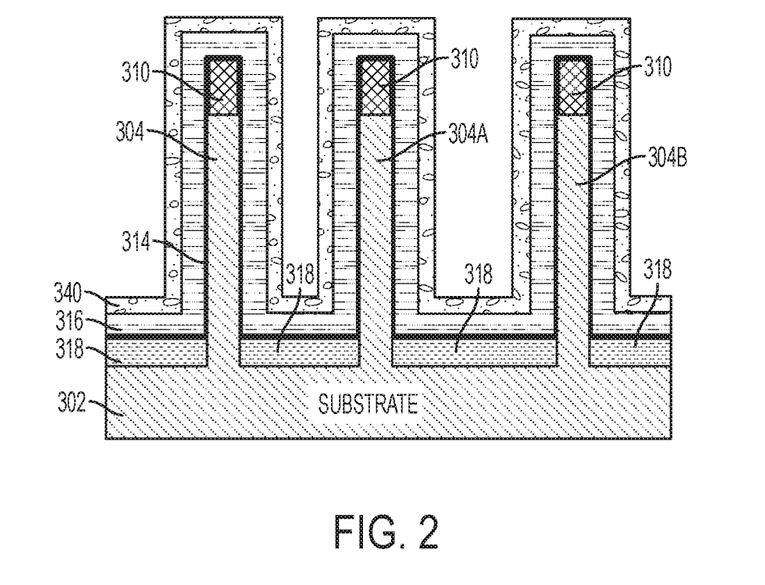
FIG. 2 depicts a cross-sectional view of a semiconductor structure after a fabrication operation according to embodiments of the invention.

FIGS. 2-8 depict cross-sectional views of a semiconductor structure after fabrication operations according to embodiments of the invention. As shown in FIG. 2, known VTFET fabrication techniques have been used to form the VTFET structure to include a substrate 302, three fins 304, 304A, 304B, hardmasks 310, bottom spacers 318, a WFM layer 316, and a high-k dielectric layer 314, configured and arranged as shown. The substrate 302 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 302 includes a buried oxide layer (not depicted). The fins 304, 304A, 304B will form the channel of the final VTFET device. The channel fins 304, 304A, 304B, can be electrically isolated from other regions of the substrate 302 by shallow trench isolation (STI) regions (not depicted). The STI regions can be of any suitable dielectric material, such as, for example, a silicon oxide.

The type of material used to form the WFM layer 316 depends on the type of VTFET and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The WFM 316 can be deposited by a suitable deposition process, for example, CVD, PECVD, PVD, plating, thermal or e-beam evaporation, and sputtering.

The high-k dielectric layer 314 can be a dielectric material having a dielectric constant greater than, for example, 3.9, 7.0, or 10.0. Non-limiting examples of suitable materials for the high-k dielectric layer 314 include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric layer 314 can further include dopants such as, for example, lanthanum and aluminum. The high-k dielectric layer 314 can be formed by suitable deposition processes, for example, CVD, PECVD, atomic layer deposition (ALD), evaporation, physical vapor deposition (PVD), chemical solution deposition, or other like processes. The thickness of the high-k dielectric layer 314 can vary depending on the deposition process as well as the composition and number of high-k dielectric materials used.

In accordance with embodiments of the invention, a relatively thin dielectric spacer layer 340 has been conformally deposited over the WFM layer 316. In embodiments of the invention, the relatively thin (e.g., from about 20 A to about 70 A) dielectric spacer layer 340 can be deposited using a precisely controlled layer-by-layer process such as atomic layer deposition (ALD). As depicted in FIG. 2, the spacer layer 340 occupies only a fraction of the space around and/or between any of the fins 304, 304A, 304B.

Figure 3:
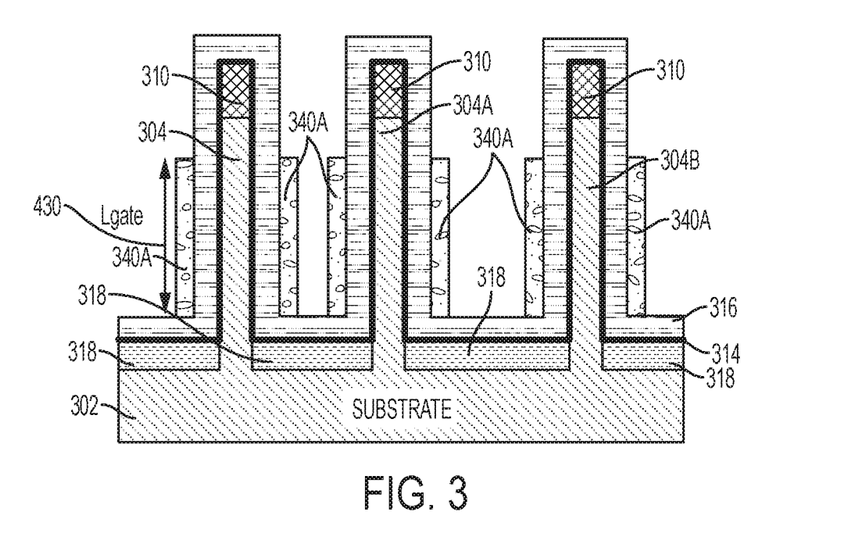
FIG. 3 depicts a cross-sectional view of a semiconductor device after a fabrication operation according to embodiments of the invention.
Figure 6:
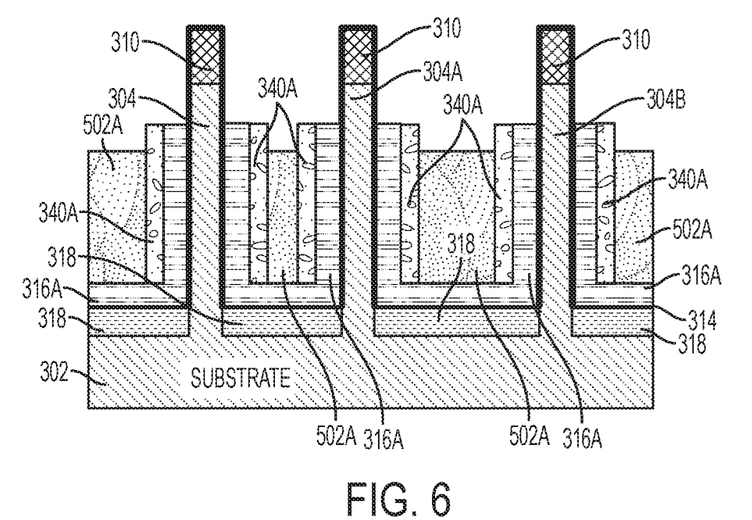
FIG. 6 depicts a cross-sectional view of a semiconductor device after a fabrication operation according to embodiments of the invention.
Figure 7:
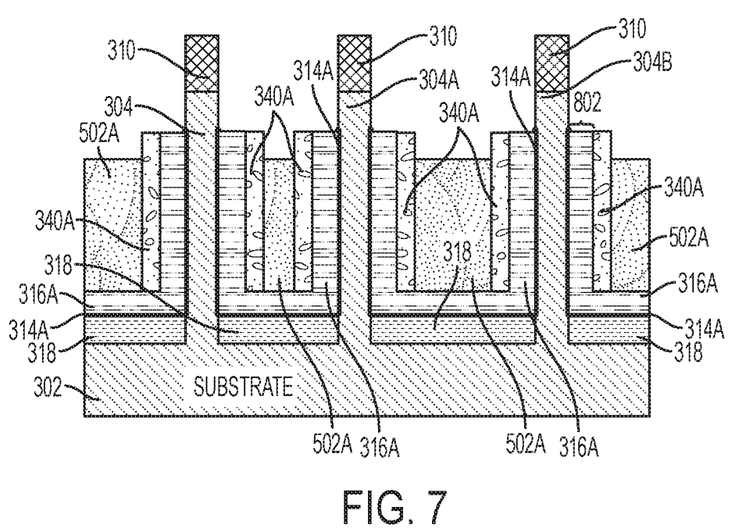
FIG. 7 depicts a cross-sectional view of a semiconductor device after a fabrication operation according to embodiments of the invention.

In FIG. 3, a RIE has performed in order to remove selected portions of the relatively thin dielectric spacer layer 340 (shown in FIG. 2) to form relatively thin dielectric spacers 340A. In embodiments of the invention, the RIE etches the spacer layer 340 in a substantially vertical direction until a desired height of the spacer 340A is reached. The spacer height is selected to be substantially equal to the desired gate length, which is depicted in FIG. 3 as Lgate 430. In a subsequent fabrication operation, which is depicted in FIGS. 6 and 7 and described in more detail subsequently herein, the vertical gate structure will be formed by performing a wet/dry etch to remove the WFM layer 316 and the high-k dielectric layer 314 selective to the height of the relatively thin dielectric spacers 340A. Hence, the height of the relatively thin dielectric spacers 340A define the Lgate dimensions of the vertical gate structures that will be formed from the non-etched portions of the WFM layer 316 and the high-k dielectric layer 314.

Figure 4:
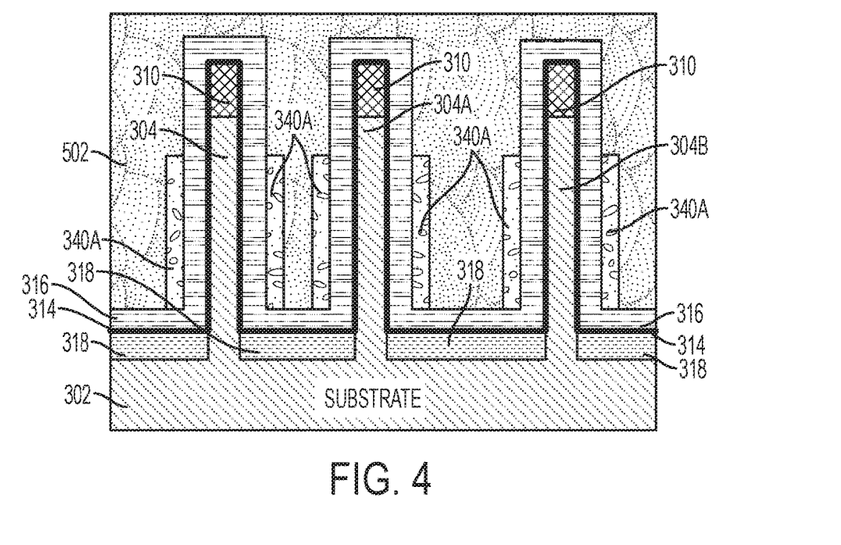
FIG. 4 depicts a cross-sectional view of a semiconductor device after a fabrication operation according to embodiments of the invention.

In FIG. 4, an OPL 502 has been deposited over exposed surfaces of the WFM 316 and the spacers 340A. The OPL 502 can protect the exposed surfaces of the WFM 316 and the high-k dielectric layer 314 from subsequent removal/etching processes. The OPL 502 can be a self-planarizing organic material such as a polymer with sufficiently low viscosity that the top surface of the applied polymer can form, under the appropriate conditions (e.g., no underlying density differences), a substantially planar and horizontal surface. For ease of illustrations, the OPL 502 is depicted with a substantially planar and horizontal upper surface. However, in practice, particularly when the spaces between and around the fins 304, 304A, 304B are not all the same, the upper surface of the OPL 502 will be substantially non-planar in areas of lower or different underlying pattern density, similar to the recessed OPL layer 112 shown in FIG. 1.

Figure 5:
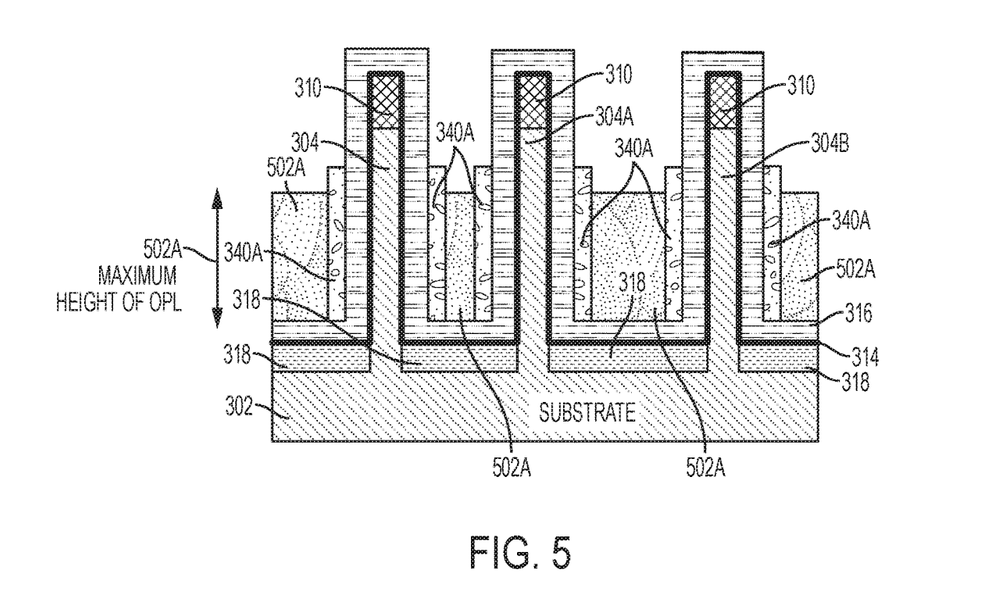
FIG. 5 depicts a cross-sectional view of a semiconductor device after a fabrication operation according to embodiments of the invention.

In FIG. 5, the OPL 502 has been recessed in a substantially vertical direction to form OPL regions 502A. The upper surfaces of the OPLs 502A are all below a top surface of the relatively thin spacers 340A but above horizontal surfaces of bottom portions of the WFM 316. According to embodiments of the invention, the vertically directed recess of the OPL 502 does not need to be precisely controlled. As previously noted herein, because of lower or different pattern densities underlying the OPL 502, the upper surface of the OPL 502 is substantially non-planar. Hence, the upper surfaces of the recessed OPLs 502A are also substantially non-planar. The maximum height dimension of the top surfaces of the post-recess OPLs 502A according to embodiments of the invention only needs to stop somewhere along a sidewall of the relatively thin spacers 340A, below an upper horizontal surface of the relatively thin spacer 340A, and above horizontal surfaces of the bottom portions of the WFM 316. The OPL 502 can be recessed using any suitable process, such as, for example, a wet etch, a dry etch, or a combination thereof.

In FIG. 6, an initial portion of the vertical gate structure 802 (shown in FIG. 7) is formed by performing a wet/dry etch to remove the WFM layer 316 selective to the height of the relatively thin dielectric spacers 340A to form WFM regions 316A. Hence, the height of the relatively thin dielectric spacers 340A defines the height of the WFM regions 316A. Because the spacers 340A are relatively thin, the spacers 340A were formed using closely controlled layer-by-layer deposition (e.g., ALD) and RIE, and the spaces between and around the fins 304, 304A, 304B do not impact the width/height dimensions of the spacer 340A, the upper horizontal surfaces of the spacers 340A are substantially co-planar with the upper horizontal surfaces of the WFM regions 316A.

In FIG. 7, the vertical gate structure 802 is formed by performing a wet/dry etch to remove the high-k dielectric layer 314 selective to the height of the relatively thin dielectric spacers 340A to form high-k dielectric regions 314A. Hence, the height of the relatively thin dielectric spacers 340A defines the height of the WFM regions 316A and the high-k dielectric regions 314A, which defines the Lgate dimension (shown in FIG. 3) of the gate structure 802. Because the spacers 340A are relatively thin, the spacers 340A were formed using closely controlled layer-by-layer deposition (e.g., ALD) and RIE, and the spaces between and around the fins 304, 304A, 304B do not impact the width/height dimensions of the spacer 340A, the upper horizontal surfaces of the spacers 340A are substantially co-planar with the upper horizontal surfaces of the WFM regions 316A and the high-k dielectric regions 314A.

Figure 8:
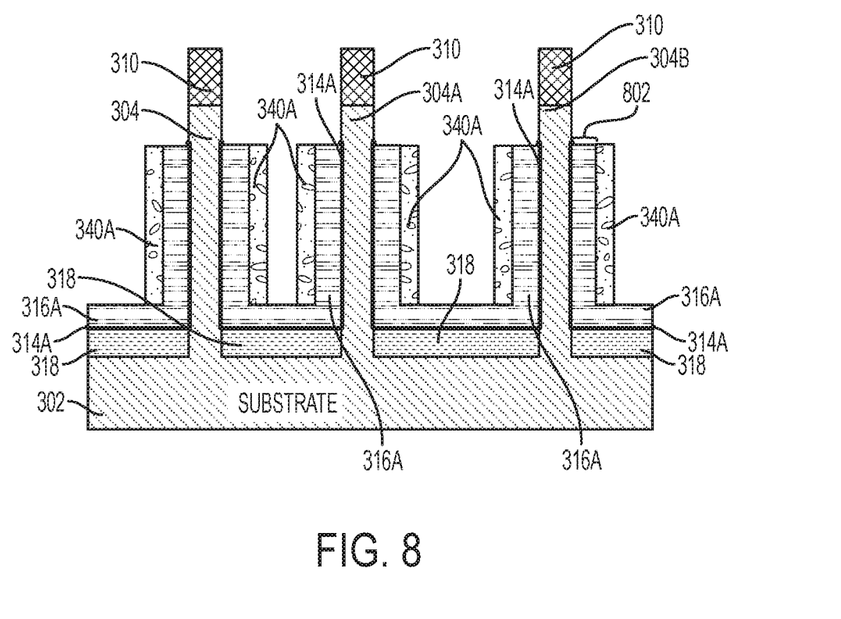
FIG. 8 depicts a cross-sectional view of a semiconductor device after a fabrication operation according to embodiments of the invention.

In FIG. 8, the OPL regions 502A have been removed using any suitable removal process. In embodiments of the invention, the OPL regions 502A can optionally remain in place while the remaining aspects of the VTFET device (e.g., source/drain regions, contacts, STI regions, etc.) are formed. The details of suitable fabrication processes to form a finished VTFET semiconductor device are known to those skilled in the art so have been omitted in the interest of brevity.

Figure 9:
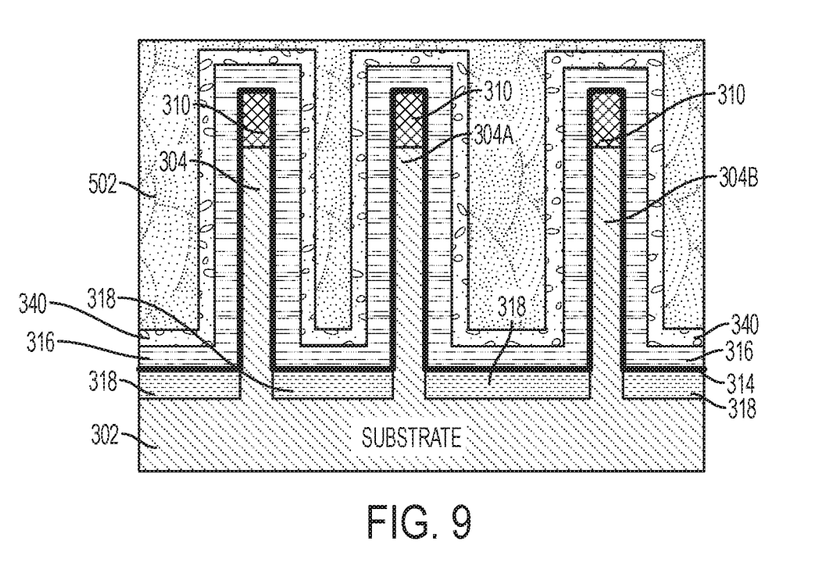
FIG. 9 depicts a cross-sectional view of a semiconductor device after a fabrication operation according to embodiments of the invention.
Figure 10:
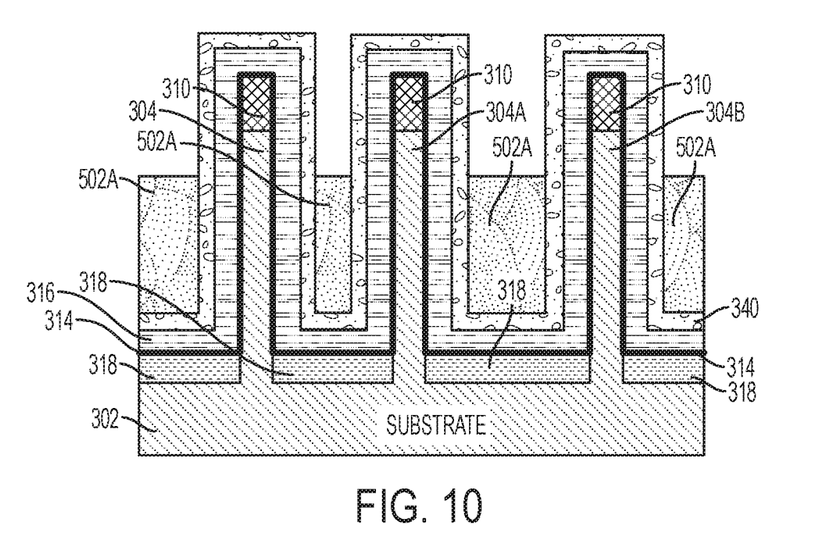
FIG. 10 depicts a cross-sectional view of a semiconductor device after a fabrication operation according to embodiments of the invention.
Figure 11:
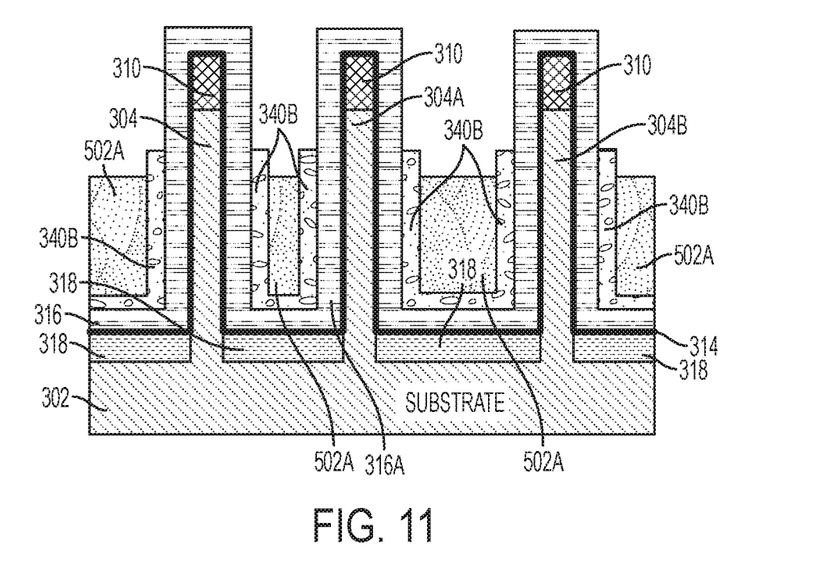
FIG. 11 depicts a cross-sectional view of a semiconductor device after a fabrication operation according to embodiments of the invention.

FIGS. 9-14 depict cross-sectional views of a semiconductor structure after fabrication operations according to embodiments of the invention. The fabrication operations depicted in FIGS. 9-14 are substantially the same as the fabrication operations depicted in FIG. 2-8 except in FIGS. 9-14 the OPL 502 is deposited and recessed to form the OPL regions 502A prior to applying the RIE to the relatively thin dielectric layer 304 to form spacers 340B shown in FIG. 11. As shown in FIG. 11, the spacers 340B maintain the horizontal bottom portions of the relatively thin dielectric spacer layer 340, and the OPL regions 502A protect the horizontal bottom portions of the relatively thin dielectric spacer layer 340 from the RIE applied to the top portions of the relatively thin dielectric layer 340.

As depicted in FIG. 9, known VTFET fabrication techniques have been used to form the VTFET structure to include the substrate 302, three fins 304, 304A, 304B, hardmasks 310, bottom spacers 318, the WFM layer 316, the high-k dielectric layer 314, and the OPL 502, configured and arranged as shown. In accordance with embodiments of the invention, the relatively thin dielectric spacer layer 340 has been conformally deposited over the WFM layer 316. In embodiments of the invention, the relatively thin (e.g., from about 20 A to about 70 A) dielectric spacer layer 340 can be deposited using a precisely controlled layer-by-layer process such as atomic layer deposition (ALD). As depicted in FIG. 2, the spacer layer 340 occupies only a fraction of the space around and/or between any of the fins 304, 304A, 304B.

As depicted in FIG. 9, the OPL 502 has been deposited over exposed surfaces of the relatively thin dielectric spacer layer 340. The OPL 502 can protect the relatively thin dielectric spacer layer 340 (and the materials underneath the spacer layer 340) from subsequent removal/etching processes. The OPL 502 can be a self-planarizing organic material such as a polymer with sufficiently low viscosity that the top surface of the applied polymer can form, under the appropriate conditions (e.g., no underlying lower or different pattern density), a substantially planar and horizontal surface. For ease of illustration, the OPL 502 is depicted with a substantially planar and horizontal upper surface. However, in practice, particularly when the spaces between and around the fins 304, 304A, 304B are not all the same, the upper surface of the OPL 502 will be substantially non-planar in areas of lower or different underlying pattern density, similar to the recessed OPL layer 112 shown in FIG. 1.

In FIG. 10, the OPL 502 has been recessed in a substantially vertical direction to form OPL regions 502A. The upper surfaces of the OPLs 502A are all below the expected Lgate dimension. According to embodiments of the invention, the vertically directed recess of the OPL 502 does not need to be precisely controlled. As previously noted herein, because of lower or different pattern densities underlying the OPL 502, the upper surface of the OPL 502 is substantially non-planar. Hence, the upper surfaces of the recessed OPLs 502A are also substantially non-planar. The maximum height dimension of the top surfaces of the post-recess OPLs 502A according to embodiments of the invention only needs to stop somewhere below the Lgate dimension. The OPL 502 can be recessed using any suitable process, such as, for example, a wet etch, a dry etch, or a combination thereof.

In FIG. 11, a RIE has performed in order to remove selected portions of the relatively thin dielectric spacer layer 340 (shown in FIG. 2) to form relatively thin dielectric spacers 340B. In embodiments of the invention, the RIE etches the spacer layer 340 in a substantially vertical direction until a desired height of the spacer 340B is reached. The spacer height is selected to be substantially equal to the desired gate length, which is depicted in FIG. 3 as Lgate 430.

Figure 12:
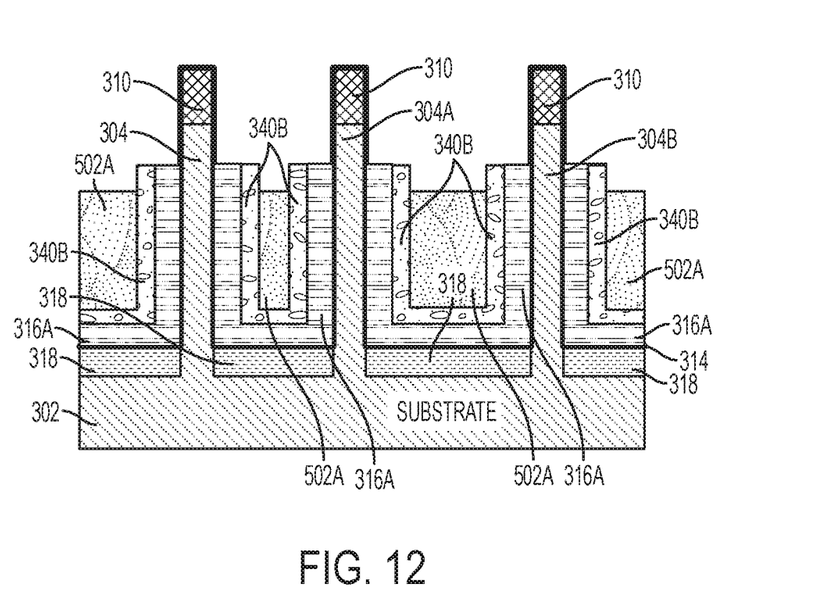
FIG. 12 depicts a cross-sectional view of a semiconductor device after a fabrication operation according to embodiments of the invention.

In FIG. 12, an initial portion of the vertical gate structure 802 (shown in FIG. 13) is formed by performing a wet/dry etch to remove the WFM layer 316 selective to the height of the relatively thin dielectric spacers 340B to form WFM regions 316A. Hence, the height of the relatively thin dielectric spacers 340B defines the height of the WFM regions 316A. Because the spacers 340B are relatively thin, the spacers 340B were formed using closely controlled layer-by-layer deposition (e.g., ALD) and RIE, and the spaces between and around the fins 304, 304A, 304B do not impact the width/height dimensions of the spacer 340B, the upper horizontal surfaces of the spacers 340B are substantially co-planar with the upper horizontal surfaces of the WFM regions 316A.

Figure 13:
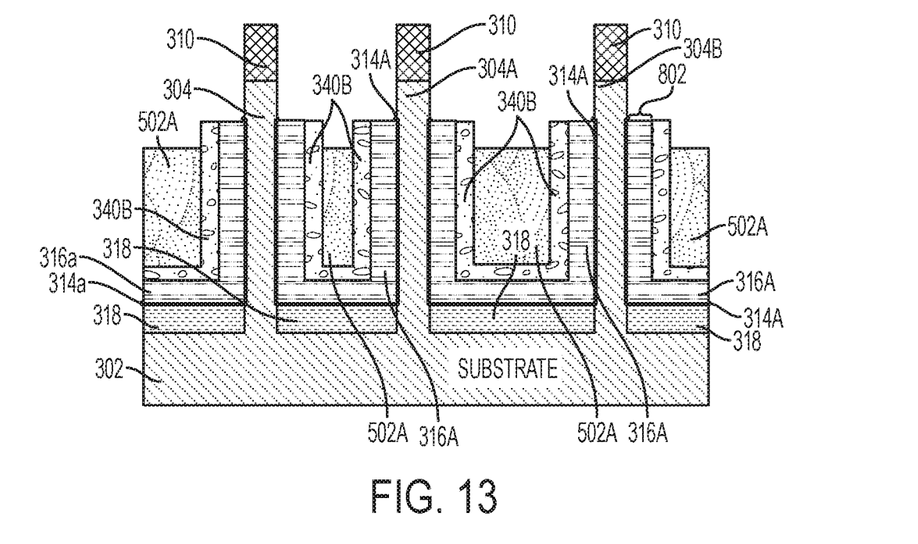
FIG. 13 depicts a cross-sectional view of a semiconductor device after a fabrication operation according to embodiments of the invention.

In FIG. 13, the vertical gate structure 802 is formed by performing a wet/dry etch to remove the high-k dielectric layer 314 selective to the height of the relatively thin dielectric spacers 340B to form high-k dielectric regions 314A. Hence, the height of the relatively thin dielectric spacers 340B defines the height of the WFM regions 316A and the high-k dielectric regions 314A, which defines the Lgate dimension (shown in FIG. 3) of the gate structure 802. Because the spacers 340B are relatively thin, the spacers 340B were formed using closely controlled layer-by-layer deposition (e.g., ALD) and RIE, and the spaces between and around the fins 304, 304A, 304B do not impact the width/height dimensions of the spacers 340B, the upper horizontal surfaces of the spacers 340B are substantially co-planar with the upper horizontal surfaces of the WFM regions 316A and the high-k dielectric regions 314A.

Figure 14:
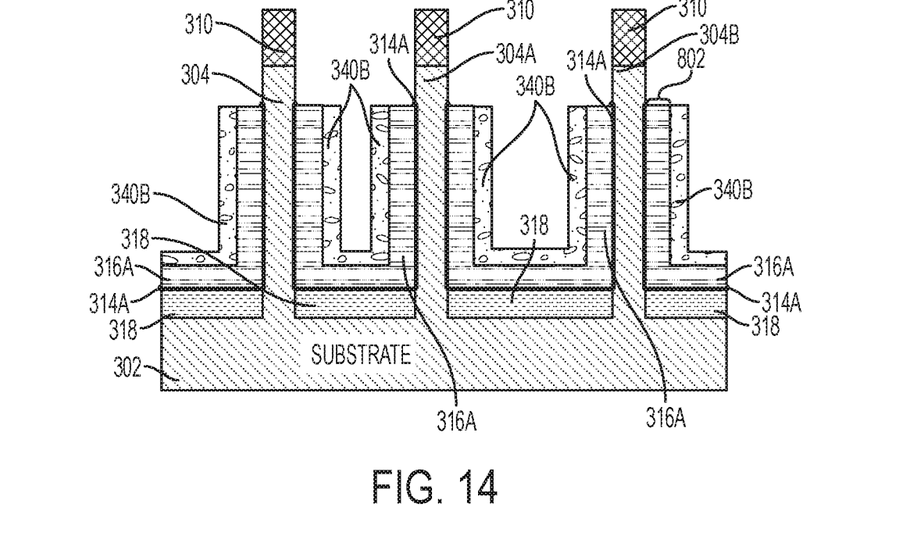
FIG. 14 depicts a cross-sectional view of a semiconductor device after a fabrication operation according to embodiments of the invention.

In FIG. 14, the OPL regions 502A have been removed using any suitable removal process. In embodiments of the invention, the OPL regions 502A can optionally remain in place while the remaining aspects of the VTFET device (e.g., source/drain regions, contacts, STI regions, etc.) are formed. The details of suitable fabrication processes to form a finished VTFET semiconductor device are known to those skilled in the art so have been omitted in the interest of brevity.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:

forming a channel fin structure across from a major surface of a substrate, wherein the channel fin structure comprises a plurality of channel fins, wherein a first spacing is defined between adjacent ones of a first set of the plurality of channel fins, wherein a second spacing is defined between adjacent ones of a second set of the plurality of channel fins, wherein the first spacing is not equal to the second spacing;

forming an initial gate structure over the plurality of channel fins;

forming spacers along vertical sidewall portions of the initial gate structure, each of the spacers having a predetermined spacer height dimension, wherein a thickness dimension of each of the spacers is insufficient to allow any one of the spacers to fill the first spacing or the second spacing; and subsequent to forming the spacers along the vertical sidewall portions of the initial gate structure, removing portions of the initial gate structure where the vertical sidewall portions of the initial gate structure are not covered by the spacers to define a plurality of gate structures each having a gate structure height dimension defined by the spacer height dimension;

wherein a gate length dimension of each of the plurality of gate structures comprises the gate height dimension.

2. The method of claim 1, wherein forming the spacers comprises forming a layer of spacer material over the initial gate structure.

3. The method of claim 2, wherein forming the layer of spacer material comprises a layer-by-layer deposition process.

4. The method of claim 2, wherein forming the layer of spacer material comprises an atomic layer deposition (ALD) process.

5. The method of claim 4, wherein forming the spacers further comprises removing selected portions of the layer of spacer material to define the spacers.

6. The method of claim 1, wherein the thickness dimension of each of the spacers is from about 20 A to about 70 A.

7. The method of claim 1, wherein at least one of the spacers occupies a portion of the first spacing.

8. The method of claim 7 further comprising depositing an organic planarization layer (OPL) material in the portions of the first spacing not occupied by the at least one of the spacers.

9. The method of claim 1, wherein at least one of the spacers occupies a portion of the second spacing.

10. The method of claim 9 further comprising depositing an organic planarization layer (OPL) material in the portions of the second spacing not occupied by the at least one of the spacers.

11. The method of claim 1, wherein the gate structure comprises a work function metal.

12. The method of claim 11, wherein the gate structure further comprises a high-k dielectric.

* * * * *